(12) United States Patent
Sun et al.

(10) Patent No.: US 12,364,116 B2
(45) Date of Patent: Jul. 15, 2025

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Kuo Sun, Beijing (CN); Pinfan Wang, Beijing (CN); Yucheng Chan, Beijing (CN); Wenqiang Li, Beijing (CN); Zhenhua Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 679 days.

(21) Appl. No.: 17/630,132

(22) PCT Filed: Apr. 9, 2021

(86) PCT No.: PCT/CN2021/086123
§ 371 (c)(1),
(2) Date: Jan. 25, 2022

(87) PCT Pub. No.: WO2021/223566
PCT Pub. Date: Nov. 11, 2021

(65) Prior Publication Data
US 2022/0262888 A1    Aug. 18, 2022

(30) Foreign Application Priority Data

May 6, 2020    (CN) .......................... 202010372083.2

(51) Int. Cl.
*H10K 59/35*    (2023.01)
*H10K 59/131*    (2023.01)

(52) U.S. Cl.
CPC ......... *H10K 59/131* (2023.02); *H10K 59/353* (2023.02); *H10K 59/351* (2023.02)

(58) Field of Classification Search
CPC .................. H10K 59/351–353; H10K 59/131
See application file for complete search history.

(56) References Cited

U.S. PATENT DOCUMENTS 9,013,098 B1 *    4/2015    Kim .................... H10K 59/352
                                                            313/504
2016/0033120 A1    2/2016    Yan et al.
(Continued)

FOREIGN PATENT DOCUMENTS

| CN | 106502474 A | 3/2017 |
| CN | 107039008 A | 8/2017 |

(Continued)

OTHER PUBLICATIONS

CN202010372083.2 first office action.
CN202010372083.2 second office action.

*Primary Examiner* — Eric K Ashbahian
(74) *Attorney, Agent, or Firm* — IPro, PLLC

(57) ABSTRACT

Disclosed are a display panel and a display device. The display panel includes: a plane display unit; and a corner display unit. The corner display unit is located at the corner position on the periphery of the plane display unit, and has a plurality of corner pixels. Each corner pixel includes four corner sub-pixels, i.e., a first corner sub-pixel and a second corner sub-pixel respectively located on two opposite vertexes of a quadrilateral, and a third corner sub-pixel and a fourth corner sub-pixel located another two opposite vertexes of the quadrilateral. The first corner pixel drive circuit, the second corner pixel drive circuit, the third corner pixel drive circuit, and the fourth corner pixel drive circuit are located in the same corner pixel drive circuit row.

19 Claims, 8 Drawing Sheets

(56) References Cited

U.S. PATENT DOCUMENTS

| | | | |
|---|---|---|---|
| 2017/0219895 A1 | 8/2017 | Yu et al. | |
| 2018/0166018 A1* | 6/2018 | Yang | |
| 2019/0312098 A1* | 10/2019 | Matsueda | G09G 3/3266 |
| 2020/0185463 A1* | 6/2020 | Liu | H10K 59/353 |
| 2021/0043147 A1 | 2/2021 | Hao et al. | |
| 2021/0217831 A1* | 7/2021 | Jung | H10K 59/353 |
| 2021/0313410 A1* | 10/2021 | Kim | H10K 59/131 |
| 2021/0351249 A1 | 11/2021 | Yang et al. | |
| 2022/0208891 A1* | 6/2022 | Liu | H10K 59/353 |

FOREIGN PATENT DOCUMENTS

| | | |
|---|---|---|
| CN | 105303974 B | 10/2017 |
| CN | 107610636 A | 1/2018 |
| CN | 107742623 A | 2/2018 |
| CN | 207338364 U | 5/2018 |
| CN | 109860242 A | 6/2019 |
| CN | 209691758 U | 11/2019 |
| CN | 111509023 A | 8/2020 |
| JP | 2012173489 A | 9/2012 |

* cited by examiner

DISPLAY PANEL AND DISPLAY DEVICE

CROSS REFERENCE TO RELATED APPLICATIONS

The present application is a US National Stage of International Application No. PCT/CN2021/086123, filed on Apr. 9, 2021, which claims priority to Chinese Patent Application No. 202010372083.2, entitled "Display Panel and Display Device", and filed to the China Patent Office on May 6, 2020, the entire contents of which are incorporated herein by reference.

FIELD

The present disclosure relates to the field of display, in particular to a display panel and a display device.

BACKGROUND

Increasingly updated customer requirements pose new challenges to the morphological design of screens. In order to achieve a more stunning display effect, a screen design with four stretchable corners is proposed. This screen can achieve a higher screen-to-body ratio.

The screen with the four stretchable corners needs to be provided with a plurality of through grooves in four corner regions, so that when the screen is attached to a cover plate (positions, corresponding to the four corner regions of the screen, of the cover plate are each in an arc shape with both sides bent downwards), stretching and bending are easy, and better attachment with the cover plate is achieved. However, a current screen with four corners stretchable has a low pixel resolution in four corner regions, which is not conducive to rounded display at four corner positions.

SUMMARY

An embodiment of the present disclosure provides a display panel, including: a plane display part; a corner display part, located at a corner position on a periphery of the plane display part, and having a plurality of corner pixels, wherein each corner pixel includes four corner sub-pixels including a first corner sub-pixel and a second corner sub-pixel respectively located on two opposite vertexes of a quadrilateral, and a third corner sub-pixel and a fourth corner sub-pixel located on another two opposite vertexes of the quadrilateral; and a plurality of corner pixel drive circuits, wherein each corner pixel drive circuit includes a first corner pixel drive circuit electrically connected to the first corner sub-pixel, a second corner pixel drive circuit electrically connected to the second corner sub-pixel, a third corner pixel drive circuit electrically connected to the third corner sub-pixel, and a fourth corner pixel drive circuit electrically connected to the fourth corner sub-pixel; and the first corner pixel drive circuit, the second corner pixel drive circuit, the third corner pixel drive circuit, and the fourth corner pixel drive circuit are located in the same corner pixel drive circuit row.

In a possible implementation, the first corner sub-pixel is a sub-pixel emitting blue light, the second corner sub-pixel is a sub-pixel emitting red light, the third corner sub-pixel is a sub-pixel emitting green light and the fourth corner sub-pixel is a sub-pixel emitting green light.

In a possible implementation, an extending direction of the corner pixel drive circuit row is parallel to a first direction, and the first corner sub-pixel and the second corner sub-pixel all have overlapping regions with the corner pixel drive circuit row; the first corner sub-pixel includes a first anode, and the first anode is electrically connected to the first corner pixel drive circuit at an overlapping position; and the second corner sub-pixel includes a second anode, and the second anode is electrically connected to the second corner pixel drive circuit at an overlapping position.

In a possible implementation, the third corner sub-pixel includes a third anode, and the fourth corner sub-pixel includes a fourth anode; and the display panel further includes a third connecting line and a fourth connecting line, the third anode is electrically connected to the third corner pixel drive circuit through the third connecting line, and the fourth anode is electrically connected to the fourth corner pixel drive circuit through the fourth connecting line.

In a possible implementation, an extending direction of the third connecting line is perpendicular to the first direction; the fourth connecting line include a first connecting portion with an extending direction parallel to the first direction, and a second connecting portion with an extending direction perpendicular to the first direction; and one end of the first connecting portion is electrically connected to the fourth anode, another end of the first connecting portion is electrically connected to the second connecting portion, and another end of the second connecting portion is electrically connected to the fourth corner pixel drive circuit.

In a possible implementation, the third connecting line and the third anode are disposed on the same layer and made of the same material, and the fourth connecting line and the fourth anode are disposed on the same layer and made of the same material.

In a possible implementation, the plane display part includes a plurality of plane sub-pixels distributed in an array, and a density of the corner sub-pixels is less than a density of the plane sub-pixels.

In a possible implementation, the plane display part includes a plurality of pixel row groups, and each pixel row group includes a first sub-pixel row, a second sub-pixel row, and a third sub-pixel row that are sequentially disposed; and the first corner sub-pixel, the second corner sub-pixel, and the second sub-pixel row are located in the same sub-pixel row.

In a possible implementation, the third corner sub-pixel and the first sub-pixel row are located in the same sub-pixel row; and the fourth corner sub-pixel and the third sub-pixel row are located in the same sub-pixel row.

In a possible implementation, the each pixel row group further includes a fourth sub-pixel row located on a side of the third sub-pixel row away from the second sub-pixel row.

In a possible implementation, the plane display part includes a plurality of plane pixel drive circuits electrically connected to the plane sub-pixels in a one-to-one correspondence mode; and a region occupied by the corner pixel drive circuits is smaller than a region occupied by the plane pixel drive circuits.

In a possible implementation, interfacing positions of the corner display part where the corner display part is interfaced with the plane display part have a plurality of gate drive circuit groups arranged in sequence in an extending direction of the interfacing positions, and each gate drive circuit group includes at least two columns of gate drive circuits.

In a possible implementation, the corner pixels are disposed between adjacent gate drive circuit groups.

In a possible implementation, in the each corner pixel, a minimum width of a gap between the first corner sub-pixel and the second corner sub-pixel in a first direction is the same as a maximum width of the third corner sub-pixel in the first direction.

In a possible implementation, a minimum width of a gap between two adjacent corner pixels in the same corner pixel row in the first direction is the same as a maximum width of the fourth corner sub-pixel in the first direction; and a minimum length of a gap between two adjacent corner pixels in the same corner pixel column in a second direction is greater than a width of the fourth corner sub-pixel in the second direction.

In a possible implementation, the display panel further includes a plurality of sections of through grooves, and the through grooves are located at gaps between adjacent corner pixels.

An embodiment of the present disclosure further provides a display device, including the display panel provided by the embodiments of the present disclosure.

DETAILED DESCRIPTION OF THE EMBODIMENTS

In order to make the objectives, technical solutions, and advantages of embodiments of the present disclosure clearer, the technical solutions of the embodiments of the present disclosure will be described clearly and completely with reference to the accompanying drawings of the embodiments of the present disclosure. Apparently, the described embodiments are some, but not all, embodiments of the present disclosure. Based on the described embodiments of the present disclosure, all other embodiments attainable by those ordinarily skilled in the art without involving any inventive effort are within the protection scope of the present disclosure.

Unless defined otherwise, technical terms or scientific terms used in the present disclosure shall have the ordinary meaning as understood by those ordinarily skilled in the art to which the present disclosure belongs. The words "first", "second", and similar referents used in the present disclosure do not denote any order, quantity, or importance, but rather are used solely to distinguish one from another. The word "include" or "comprise", and other similar words used in the present disclosure mean that a component or an article that precedes the word is inclusive of the component or article listed after the word and equivalents thereof, but does not exclude other components or articles. Similar words such as "connection" or "connected" are not limited to physical or mechanical connections, but may include electrical connections, whether direct or indirect. The terms "upper", "lower", "left", "right", and the like are used merely to denote a relative positional relationship that may change accordingly when the absolute position of an object being described changes.

In order to keep the following descriptions of the embodiments of the present disclosure clear and concise, the present disclosure omits detailed descriptions of known functions and known components.

Figure 1:
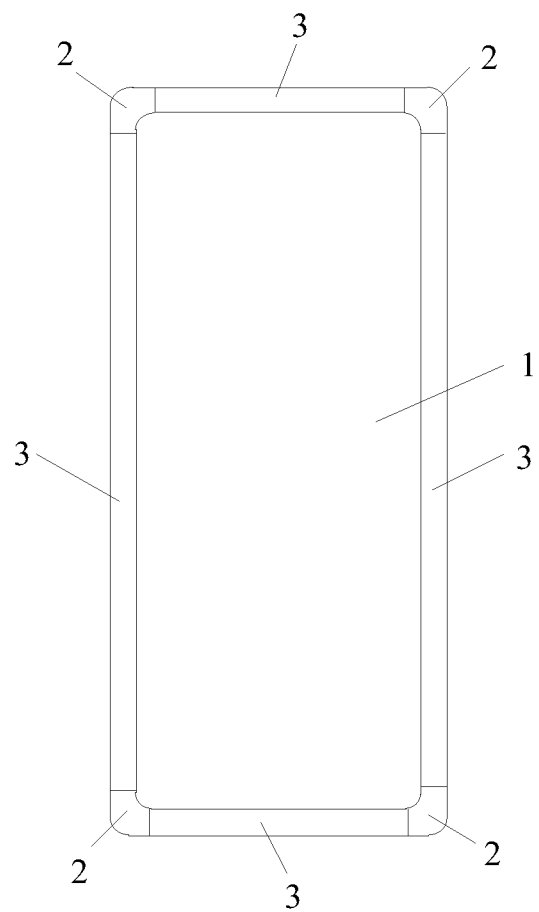
FIG. 1 is a schematic structural diagram of a display panel provided by an embodiment of the present disclosure.
Figure 2:
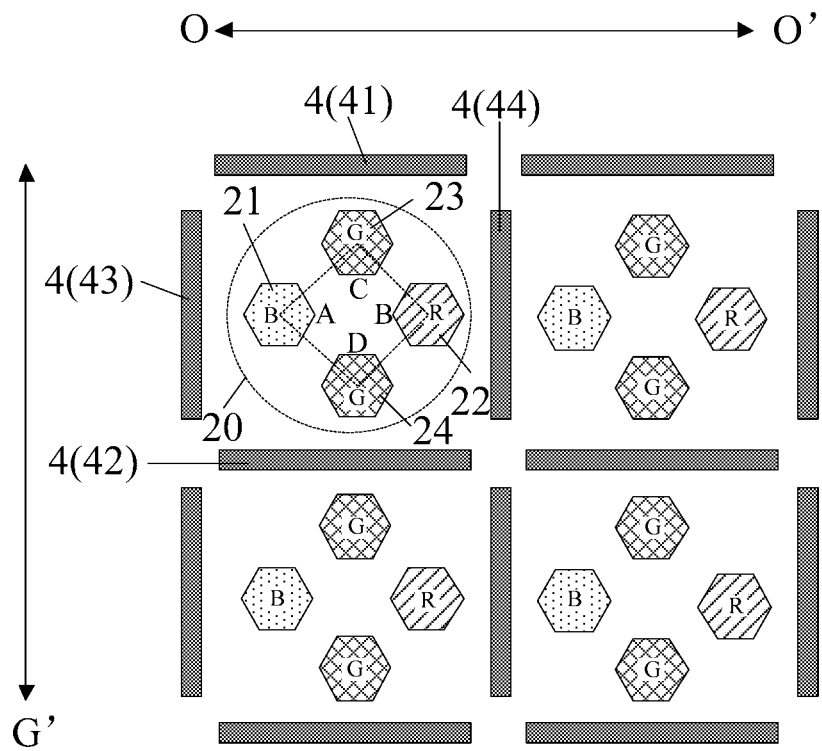
FIG. 2 is a partial schematic structural diagram of a corner display part of a display panel according to an embodiment of the present disclosure.
Figure 4:
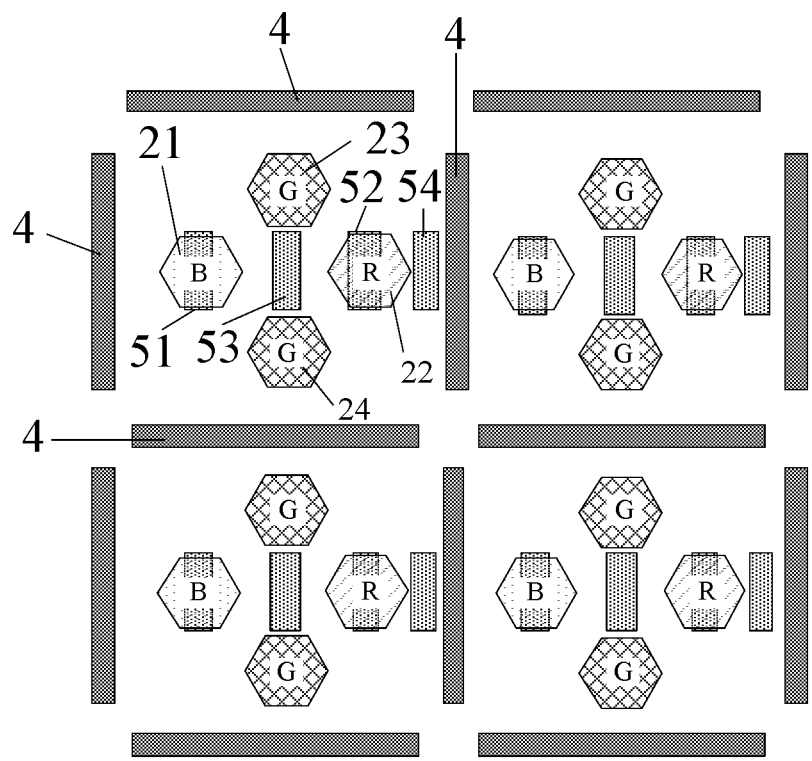
FIG. 4 is a schematic diagram of a structure with corner pixel drive circuits provided by an embodiment of the present disclosure.

An embodiment of the present disclosure provides a display panel, as shown in FIG. 1, FIG. 2 and FIG. 4. FIG. 2 is a schematic diagram of an enlarged structure of a corner display part of FIG. 1.

The display panel includes: a plane display part 1. When the plane display part 1 is attached to a cover plate (not shown in the figure), it may be a display region that is not bent. A frame portion 3 may be disposed on the periphery of the plane display part 1. When the frame portion 3 is attached to the cover plate, one side (outer edge) may be bent, and a resolution ratio of the plane display part 1 and a resolution ratio of the frame portion 3 are the same.

The display panel further includes a corner display part 2. The corner display part 2 is located at a corner position on the periphery of the plane display part 1, and has a plurality of quadrilateral corner pixels 20 distributed in an array, where the quadrilateral may be a rhombus. Each corner pixel 20 includes four corner sub-pixels, i.e., a first corner sub-pixel 21 and a second corner sub-pixel 22 located on two opposite vertexes of the quadrilateral, and a third corner sub-pixel 23 and a fourth corner sub-pixel 24 located on another two opposite vertexes of the quadrilateral. For example, as shown in FIG. 2, the first corner sub-pixel 21 is located at a first vertex A of the quadrilateral, the second corner sub-pixel 22 is located at a second vertex B of the quadrilateral, the third corner sub-pixel 23 is located at a third vertex C of the quadrilateral, and the fourth corner sub-pixel 24 is located at a fourth vertex D of the quadrilateral. Specifically, the first corner sub-pixel 21 may be a sub-pixel that emits blue light, the second corner sub-pixel 22 may be a sub-pixel that emits red light, the third corner sub-pixel 23 may be a sub-pixel that emits green light and the fourth corner sub-pixel 24 may be a sub-pixel that emits green light.

The display panel further includes a plurality of corner pixel drive circuits. Each corner pixel drive circuit includes a first corner pixel drive circuit 51 electrically connected to the first corner sub-pixel 21, a second corner pixel drive circuit 52 electrically connected to the second corner sub-pixel 22, a third corner pixel drive circuit 53 electrically connected to the third corner sub-pixel 23, and a fourth corner pixel drive circuit 54 electrically connected to the fourth corner sub-pixel 24. The first corner pixel drive circuit 51, the second corner pixel drive circuit 52, the third corner pixel drive circuit 53, and the fourth corner pixel drive circuit 54 are located in the same corner pixel drive circuit row. It can be understood that FIG. 4 is to illustrate a positional relationship between the corner pixel drive circuits and the corner sub-pixels, and the corner pixel drive circuits are shown as rectangular bars, but the embodiment of the present disclosure is not limited thereto, and during specific implementation, the corner pixel drive circuits may be structures including a plurality of transistors and a plurality of capacitors.

In the embodiments of the present disclosure, the corner display part 2 is located at the corner position on the periphery of the plane display part 1, and has the plurality of quadrilateral corner pixels 20 distributed in an array. Each corner pixel 20 includes the four corner sub-pixels, i.e., the first corner sub-pixel 21 and the second corner sub-pixel 22 located on two opposite vertexes of a quadrilateral, and the third corner sub-pixel 23 and the fourth corner sub-pixel 24 located on another two opposite vertexes of the quadrilateral.

Figure 3A:
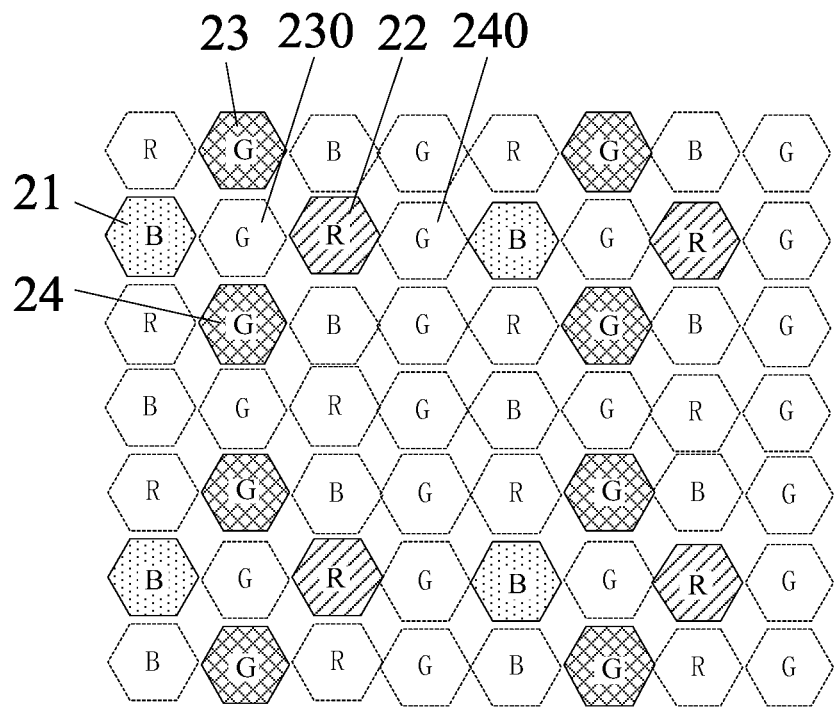
FIG. 3A is a schematic diagram of formation of corner pixels provided by an embodiment of the present disclosure.
Figure 3B:
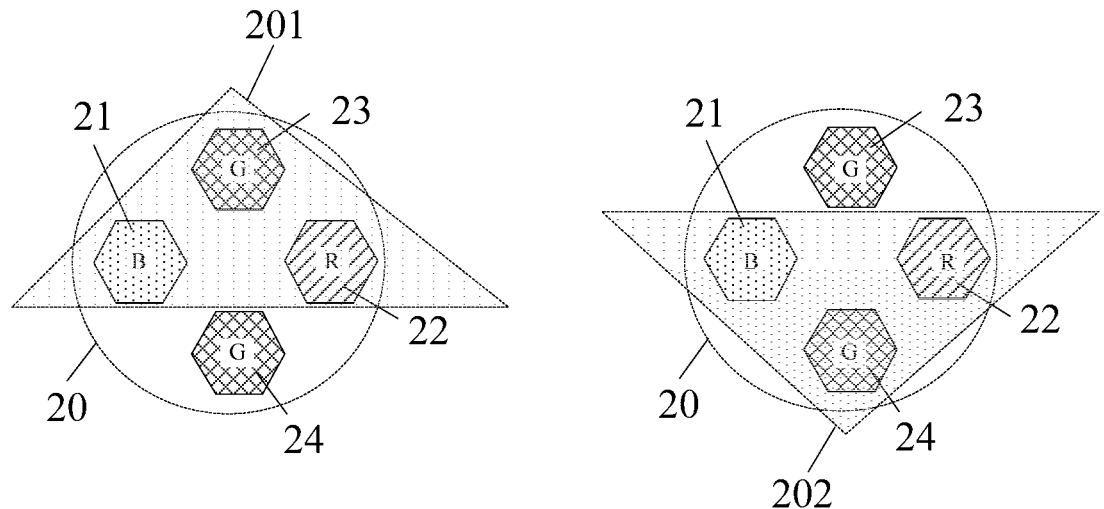
FIG. 3B is a schematic diagram of synthesizing two white corner pixels by every four corner sub-pixels provided by an embodiment of the present disclosure.
Figure 3C:
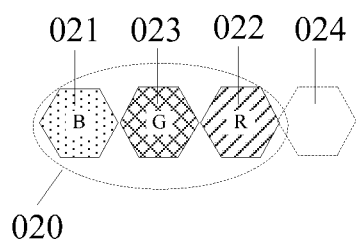
FIG. 3C is a schematic diagram of synthesizing one white corner pixel by every three corner sub-pixels in the related art.

As shown in FIGS. 3A, 3B, and 3C, it is equivalent to upwards moving an original third corner sub-pixel 230 between the first corner sub-pixel 21 and the second corner sub-pixel 22, and downwards moving an original fourth corner sub-pixel 240 on the right side of the second corner sub-pixel 22 to below a gap between the first corner sub-pixel 21 and the second corner sub-pixel 22, that is, the third corner sub-pixel 23 and the fourth corner sub-pixel 24 are jumped, so that the four corner sub-pixels are synthesized into two white corner pixels (a first white corner pixel 201 on the left side in FIG. 3B, and a second white corner pixel 202 on the right side in FIG. 3B).

Compared with the related art in the corner display part 2, as shown in FIG. 3C, for each row of corner sub-pixels, at least one corner sub-pixel is deleted every other three corner sub-pixels (such as deleting a rightmost sub-pixel 024 in FIG. 3C), the remaining three corner sub-pixels are arranged in a straight line, and only one white corner pixel 020 can be synthesized. Moreover, the first corner pixel drive circuit 51, the second corner pixel drive circuit 52, the third corner pixel drive circuit 53, and the fourth corner pixel drive circuit 54 are located in the same corner pixel drive circuit row. In the display panel provided by the embodiment of the present disclosure, the quantity of the corner pixels of the corner display part 2 is increased, the resolution ratio is improved, and the rounded display of the corner display part 2 is improved under the condition that the structures of the corner pixel drive circuits remain unchanged.

Moreover, under the condition that every four corner sub-pixels are distributed in a quadrangular shape, in the embodiments of the present disclosure, the corner pixel drive circuits that drive the corner sub-pixels distributed in the quadrangular shape are located in the same corner pixel drive circuit row, so that at least two rows of corner sub-pixels are driven by one row of corner pixel drive circuits, and it is avoided that if the third corner pixel drive circuit 53 that drives the third corner sub-pixel 23 moves up with the third corner sub-pixel 23, and the four-corner pixel drive circuit 54 that drives the fourth corner sub-pixel 24 moves down with the fourth corner sub-pixel 24, a region occupied by the corner pixel drive circuits is large, wiring is more complicated, and arrangement of through grooves 4 is not facilitated.

During specific implementation, the display panel provided by the embodiment of the present disclosure may further include a plurality of sections of through grooves 4.

The plurality of sections of through grooves 4 are located at gaps between the adjacent corner pixels 20. Each through groove 4 includes a first-type through groove 41 located on a first side (an upper side as shown in FIG. 2) of a corner pixel 20 and extending in a first direction OO', a second-type through groove 42 located on a second side (a lower side as shown in FIG. 2) of the corner pixel 20 and extending in the first direction OO', a third-type through groove 43 located on a third sides (a left side as shown in FIG. 2) of the corner pixel 20 and extending in a second direction GG', and a fourth-type through groove 44 located on a fourth side (a right side as shown in FIG. 2) of the corner pixel 20 and extending in the second direction GG'.

The first-type through grooves 41 of two adjacent corner pixels 20 in the same corner pixel row are not communicated to each other, the second-type through grooves 42 of two adjacent corner pixels 20 in the same corner pixel row are not communicated to each other, the third-type through grooves 43 of two adjacent corner pixels 20 in the same corner pixel column are not communicated to each other, and the fourth-type through grooves 44 of two adjacent corner pixels 20 in the same corner pixel column are not communicated to each other. The first direction OO' is parallel to the corner pixel rows, and the second direction GG' is parallel to a direction of the corner pixel columns.

That is, specifically, the through groove 4 may be disposed on the periphery of each corner pixel 20, and the through grooves 4 of two adjacent corner pixels 20 are not communicated to each other for wiring of signal traces (such as gate lines, data lines, etc.). For example, in FIG. 2, a first-type through groove 41 is disposed on an upper side of each corner pixel 20, a second-type through groove 42 is disposed on a lower side, a third-type through groove 43 is disposed on a left side, a four-type through groove 44 is disposed on a right side, i.e., the first-type through groove 41, the second-type through groove 42, the third-type through groove 43, and the fourth-type through groove 44 surround the corner pixel 20 to form an island, and the through grooves 4 are disposed, so that the corner display part 2 can be stretched when being attached to the cover plate.

Two adjacent corner pixels 20 in a left-right direction may share the third-type through groove 43 or the fourth-type through groove 44 between the two, the corresponding first-type through grooves 41 of the two adjacent corner pixels 20 in the left-right direction are not communicated, and the corresponding second-type through grooves 42 are not communicated.

Two upper and lower corner pixels 20 adjacent to each other may share the first-type through groove 41 or the second-type through groove 42 between the two, the corresponding third-type through grooves 43 of the two upper and lower corner pixels 20 adjacent to each other are not communicated, and the corresponding fourth-type through grooves 44 are not communicated.

Figure 3D:
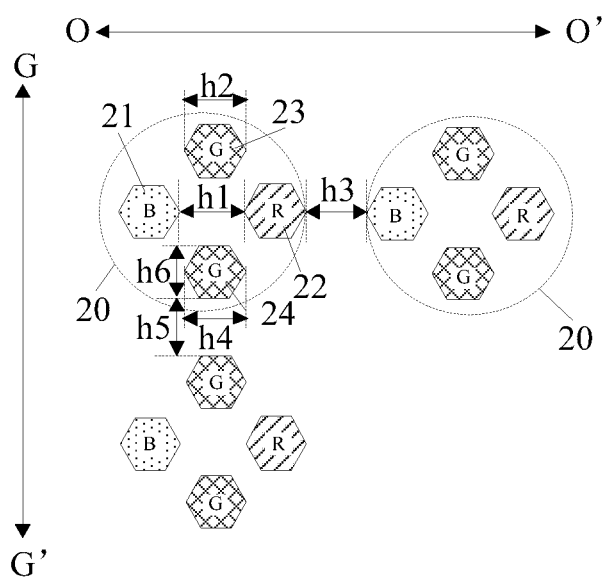
FIG. 3D is a schematic diagram of relative sizes of corner sub-pixels provided by an embodiment of the present disclosure.

During specific implementation, as shown in FIG. 3D, in the same corner pixel 20, a minimum width h1 of a gap between the first corner sub-pixel 21 and the second corner sub-pixel 22 in the first direction OO' is the same as a maximum width h2 of the third corner sub-pixel 23 in the first direction OO'. Specifically, a minimum width h3 of a gap between two adjacent corner pixels in the same corner pixel row in the first direction OO' is the same as a maximum width h4 of the fourth corner sub-pixel 24 in the first direction OO'; and a minimum length h5 of a gap between two adjacent corner pixels in the same corner pixel column in the second direction GG' is greater than a width h6 of the fourth corner sub-pixel 24 in the second direction GG'.

In the embodiments of the present disclosure, the minimum width h1 of the gap between the first corner sub-pixel 21 and the second corner sub-pixel 22 in the first direction OO' is the same as the maximum width h2 of the third corner sub-pixel 23 in the first direction OO', and the minimum width h3 of the gap between two adjacent corner pixels in the same corner pixel row in the first direction OO' is the same as the maximum width h4 of the fourth corner sub-pixel 24 in the first direction OO', so that layout of each corner sub-pixel forming the corner pixels 20 is relatively compact, which is beneficial to providing more installation space for arrangement of the through grooves 4.

Figure 5:
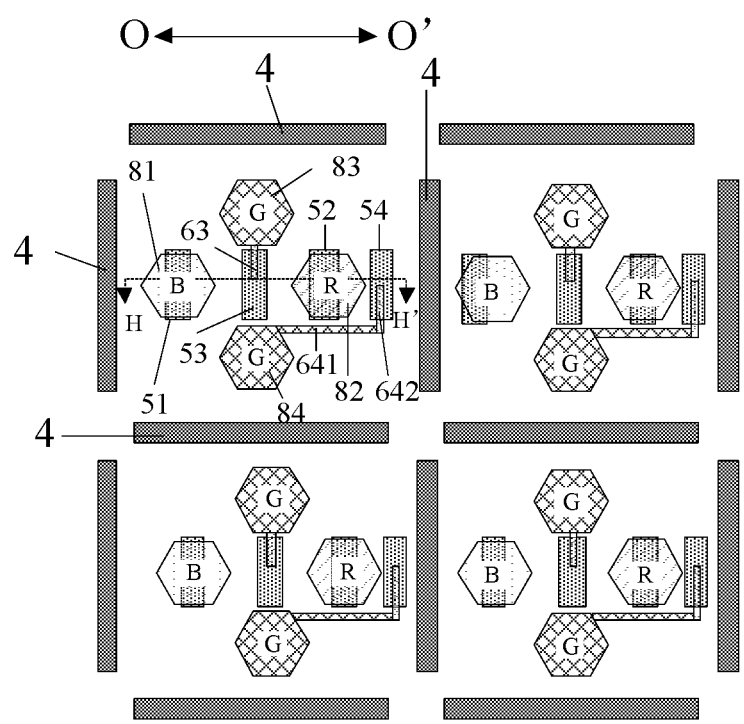
FIG. 5 is a schematic diagram of a structure with third connecting lines and fourth connecting lines provided by an embodiment of the present disclosure.

During specific implementation, as shown in FIG. 4 and FIG. 5, an extending direction of the corner pixel drive circuit rows is parallel to the first direction OO', and the first corner sub-pixels 21 and the second corner sub-pixels 22 all have overlapping regions with the corner pixel drive circuit rows. The first corner sub-pixel 21 includes a first anode 81 electrically connected to the first corner pixel drive circuit 51 at an overlapping position; and the second corner sub-pixel 22 include a second anode 82 electrically connected to the second corner pixel drive circuit 52 at an overlapping position.

Figure 6:
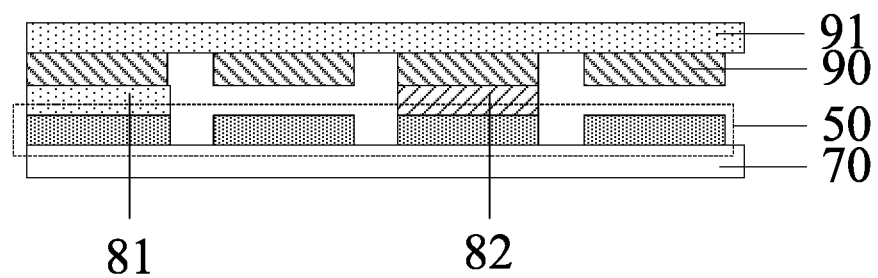
FIG. 6 is a schematic sectional structural diagram of FIG. 5 at a dashed line HH'.

Specifically, as shown in FIG. 6, FIG. 6 is a schematic cross-sectional structure diagram of FIG. 5 at a dashed line HH'. The display panel in the embodiments of the present disclosure may be an organic light emitting display panel. The display panel may specifically include a base substrate 70 at the corner display part 2, the corner pixel drive circuits 50 (specifically, may include the first corner pixel drive circuit 51, the second corner pixel drive circuit 52, the third corner pixel drive circuit 53, and the fourth corner pixel drive circuit 54) located on one side of the base substrate 70, anodes (including the first anode 81, the second anode 82, a third anode 83 and a fourth anode 84) located on a side of the corner pixel drive circuits 50 facing away from the base substrate 70, organic light emitting layers 90 located on a side of the anodes facing away from the corner pixel drive circuits 50, and a cathode layer 91 located on a side of the organic light emitting layers 90 facing away from the corner pixel drive circuits 50. Since light emitting regions of the corner sub-pixels are mainly determined by the anodes, the positions of the anodes are also the positions of the corner sub-pixels.

During specific implementation, the third corner sub-pixel 23 includes the third anode 83, and the fourth corner sub-pixel 24 includes the fourth anode 84. The display panel further includes third connecting lines 63 and fourth connecting lines. The third anode 83 and the third corner pixel drive circuit 53 are electrically connected through the third connecting line 63, and the fourth anode 84 and the fourth corner pixel drive circuit 54 are electrically connected through the fourth connecting line. In the embodiments of the present disclosure, the display panel further includes the third connecting lines 63 and the fourth connecting lines, when the third corner sub-pixel 23 is located above a connecting line between the first corner sub-pixel 21 and the second corner sub-pixel 22, the third connecting line 63 can realize the electrical connection between the third anode 83 and the third corner pixel drive circuit 53, and when the fourth corner sub-pixel 24 is located below the connecting line between the first corner sub-pixel 21 and the second corner sub-pixel 22, the four connecting line can realize the electrical connection between the fourth anode 84 and the fourth corner pixel drive circuit 54.

During specific implementation, an extending direction of the third connecting line 63 is perpendicular to the first direction OO'; the fourth connecting line includes a first connecting portion 641 with an extending direction parallel to the first direction OO', and a second connecting portion 642 with an extending direction perpendicular to the first direction OO'; and one end of the first connecting portion 641 is electrically connected to the fourth anode 84, the other end of the first connecting portion 641 is electrically connected to the second connecting portion 642, and the other end of the second connecting portion 642 is electrically connected to the fourth corner pixel drive circuit 54. In the embodiments of the present disclosure, due to an arrangement mode of the third connecting lines 63 and the fourth connecting lines, when the third corner sub-pixels 23 and the fourth corner sub-pixels 24 are jumped, the wiring complexity between the third anodes 83 and the third corner pixel drive circuits 53 as well as between the fourth anodes 84 and the fourth corner pixel drive circuits 54 is reduced.

During specific implementation, the third connecting lines 63 and the third anodes 83 are disposed on the same layer and made of the same material, and the fourth connecting lines and the fourth anodes 84 are disposed on the same layer and made of the same material. In the embodiments of the present disclosure, the third connecting lines 63 and the third anodes 83 are disposed on the same layer and made of the same material, the fourth connecting lines and the fourth anodes 84 are disposed on the same layer and made of the same material, and when the third anodes 83 and the fourth anodes 84 are prepared, the third connecting lines 63 and the fourth connecting line may be formed synchronously, so that a manufacturing process of the display panel is simplified.

Figure 7:
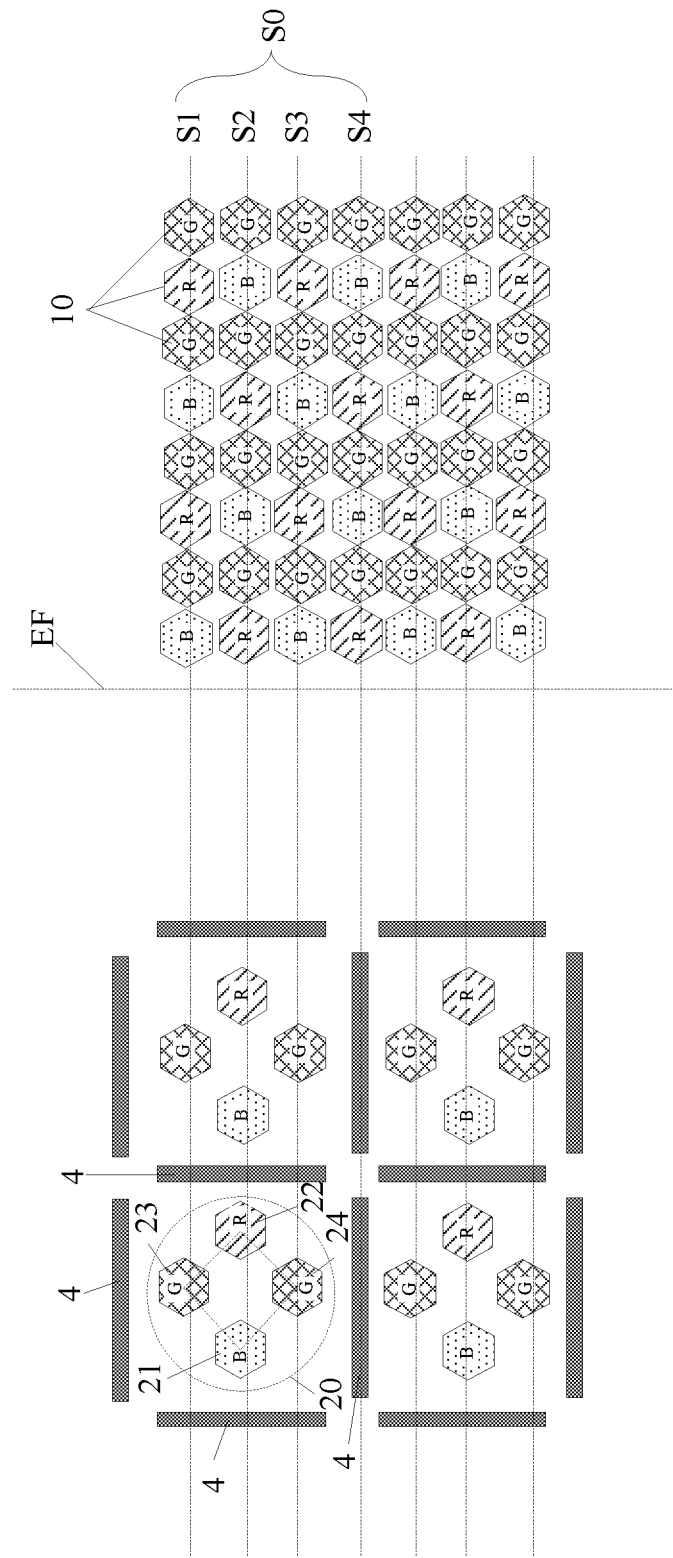
FIG. 7 is a schematic diagram of sub-pixel distribution of a corner display part and a plane display part provided by an embodiment of the present disclosure.

During specific implementation, referring to FIG. 7, which is a schematic diagram of distribution of a corner display part 2 and a plane display part at a junction position. The right side of a dividing line EF is the plane display part 1, and the left side of the dividing line EF is the corner display part 2. The plane display part 1 includes a plurality of plane sub-pixels 10 distributed in an array, and a density of the corner sub-pixels (the first corner sub-pixels 21, the second corner sub-pixels 22, the third corner sub-pixels 23, and the fourth corner sub-pixels 24) is less than a density of the plane sub-pixels 10. In the embodiments of the present disclosure, the density of the corner sub-pixels is less than the density of the plane sub-pixels 10, which can provide more arrangement space for the through grooves 4 at the corner display part 2 and facilitate the stretching of the corner display part 2.

During specific implementation, as shown in FIG. 7, the plane display part 1 includes a plurality of pixel row groups S0, and each pixel row group S0 includes a first sub-pixel row S1, a second sub-pixel row S2, and a third sub-pixel row S3 that are sequentially disposed; and the first corner sub-pixels 21, the second corner sub-pixels 22, and the second sub-pixel rows S2 are located in the same sub-pixel rows. The third corner sub-pixels 23 and the first sub-pixel rows S1 are located in the same sub-pixel rows; and the fourth corner sub-pixels 24 and the third sub-pixel rows S3 are located in the same sub-pixel rows. The pixel row group S0 further includes a fourth sub-pixel row S4 located on a side of the third sub-pixel row S3 away from the second sub-pixel row S2, and the corner display part 2 may not be provided with corner sub-pixels in the fourth sub-pixel row S4, which may be configured to arrange the through grooves 4.

In the embodiments of the present disclosure, the first corner sub-pixels 21, the second corner sub-pixels 22 are located in the same sub-pixel row as the second sub-pixel row S2, the third corner sub-pixels 23 are located in the same sub-pixel row as the first sub-pixel row S1, the fourth corner sub-pixels 24 are located in the same sub-pixel row as the third sub-pixel row S3. Arrangement of the corner sub-pixels of the corner display part 2 is equivalent to deleting two rows of sub-pixels from every three rows of sub-pixels on the basis of the plane display part 1 (for example, deleting the first sub-pixel row S1 and the third sub-pixel row S3 of the corner display part 2, and remaining the second sub-pixel row S2), and adjusting part of the sub-pixels of the remaining row (such as the second sub-pixel row S2), so that the quadrilateral distribution of the corner pixels 20 of the corner display part 2 is achieved, and due to the arrangement mode, the low-resolution-ratio distribution of the corner sub-pixels is achieved under the condition of slightly changing the distribution of the sub-pixels of the display panel.

Specifically, the pixel row groups S0 may also include more rows of sub-pixel rows located on a side of the third sub-pixel rows S3 away from the second sub-pixel rows S2.

During specific implementation, the plane display part 1 includes a plurality of plane pixel drive circuits (not shown in the figure) electrically connected to the plane sub-pixels 10 in a one-to-one correspondence mode; and a region occupied by the corner pixel drive circuits 50 is smaller than a region occupied by the plane pixel drive circuits. In the embodiment of the present disclosure, the region occupied by each corner pixel drive circuit 50 is smaller than the region occupied by each plane pixel drive circuit, so that more arrangement space is provided between the two corner pixels adjacent right and left in the corner display part.

Figure 8:
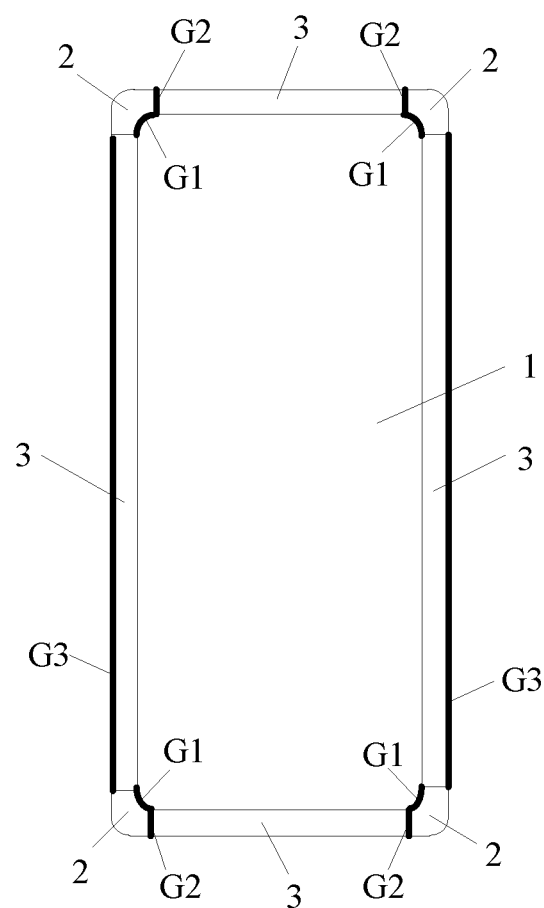
FIG. 8 is a schematic diagram of distribution of gate drive circuits provided by an embodiment of the present disclosure.
Figure 9:
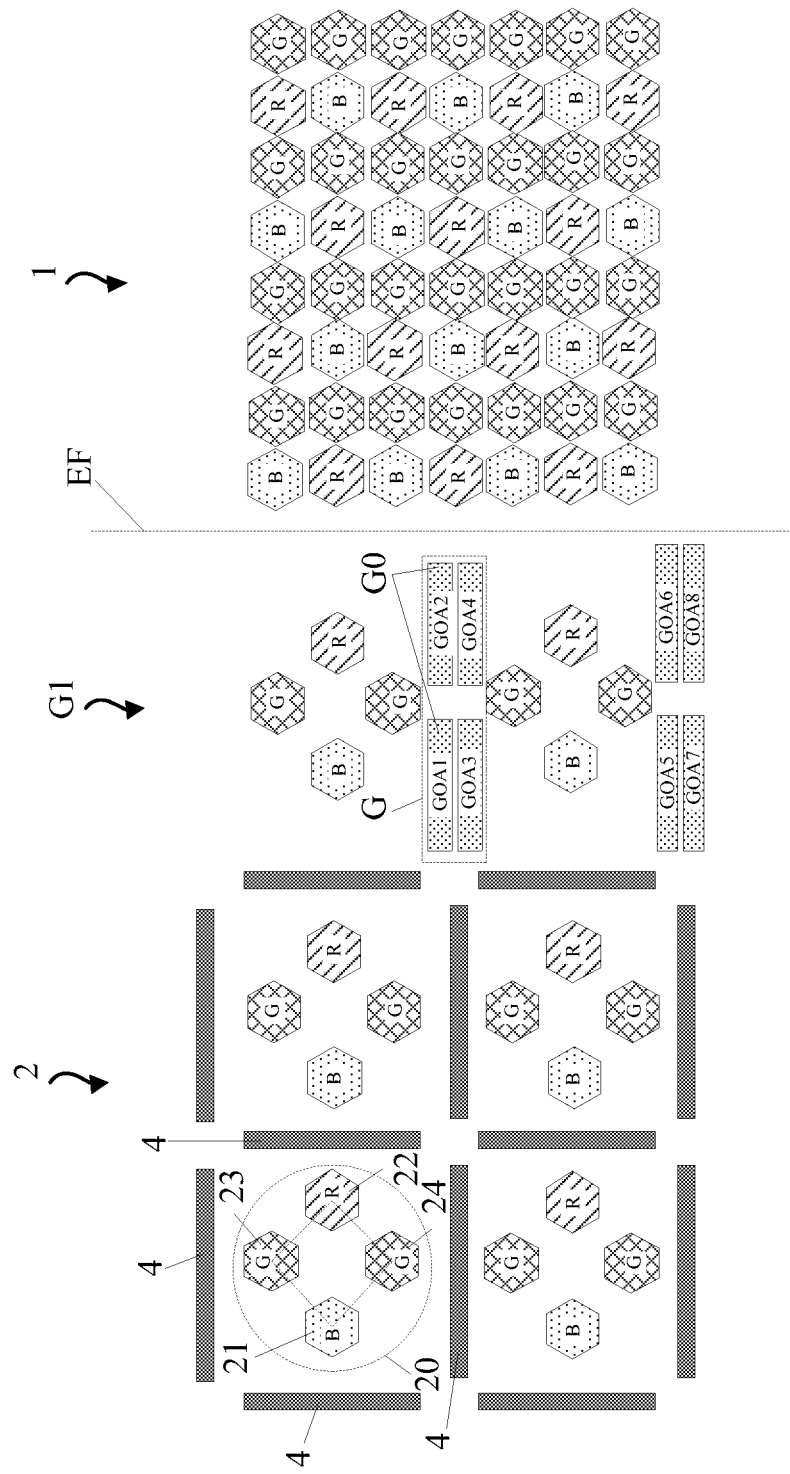
FIG. 9 is a schematic diagram of a structure with gate drive circuits provided by an embodiment of the present disclosure.

During specific implementation, referring to FIG. 8 and FIG. 9, where FIG. 9 is an enlarged schematic structural diagram of FIG. 8 at positions G1. A plurality of gate drive circuit groups G arranged in sequence in an extending direction of interfacing positions (i.e., thick black lines G1 in FIG. 8) are disposed at positions, interfacing with the plane display part 1, of the corner display part 2, and each gate drive circuit group G includes at least two columns of gate drive circuits G0 (Gate Driver on Array, GOA). For example, as shown in FIG. 9, each gate drive circuit group G includes two rows and two columns of gate drive circuits G0, and GOA1 driving the first sub-pixel rows and GOA2 driving the second sub-pixel rows adjacent to the first sub-pixel rows may be located in the same row, so that the wiring complexity of signal traces between the GOAs and the corresponding sub-pixel rows is reduced.

In the embodiments of the present disclosure, the gate drive circuits for driving the corner sub-pixels of the corner display part 2 and the plane sub-pixels of the plane display part 1 corresponding to the corner display part 2 are disposed at the positions, interfacing with the plane display part 1, of the corner display part 2, when the display panel is stretched when being attached to the cover plate, the gate drive circuits may not be configured to stretch and bend with the corner display part 2, and it is avoided that if the gate drive circuits of the corner display part 2 are disposed outer sides of the corner display part 2, the gate drive circuits need to stretch and bend along with the corner display part and the structures of the gate drive circuits are damaged. In addition, the gate drive circuits G are distributed in at least two columns, compared to the related art in which gate drive circuits GOA are usually distributed in a column, in the embodiment of the present disclosure, vertical GOAs are changed to horizontal GOAs, so that more arrangement space is provided for the arrangement of the through grooves 4.

During specific implementation, the corner pixels 20 are disposed between the adjacent gate drive circuit groups G. That is, the gate drive circuit groups G and the lateral through grooves 4 between two adjacent rows of corner pixels 20 of the corner display part 2 are located in the same row. In the embodiments of the present disclosure, the corner pixels 20 are disposed between the adjacent gate drive circuit groups G, which can avoid the occurrence of black line defects at the boundary position between the corner display part 2 and the plane display part 1 during display.

During specific implementation, as shown in FIG. 8, the gate drive circuits for driving the plane display part 1 and a first frame region and a second frame region (for example, a left frame region and a right frame region of the frame portion 3 in FIG. 8) in the frame portion 3 may be disposed on a side of the frame portion 3 away from the plane display part 1, for example, the positions of thick black lines G3 in FIG. 8, that is, the gate drive circuits are disposed on the outermost side edge of the display panel, and the gate drive circuits for driving the plane display part 1 and the gate drive circuits for driving the corner display part 2 may be connected through signal lines, that is, the gate drive circuits at the G3 positions and the gate drive circuits at the G1 positions may be connected through the signal lines; the gate drive circuits for driving a third frame region (for example, an upper frame region in FIG. 8) may be disposed at positions, interfacing with the corner display part 2, of the third frame region, that is, the positions where two thick black lines G2 at the top in FIG. 8 are located; and the gate drive circuits for driving a fourth frame region (for example, a lower frame region in FIG. 8) may be disposed at the positions, interfacing with the corner display part 2, of the fourth frame region, that is, the positions where two thick black lines G2 on the lower part in FIG. 8 are located.

Based on the same inventive concept, an embodiment of the present disclosure also provides a display device, which includes the display panel provided according to the embodiments of the present disclosure.

It will be apparent to those skilled in the art that various modifications and variations can be made in the present disclosure without departing from the spirit or scope of the present disclosure. Thus, if these modifications and variations of the present disclosure fall within the scope of the claims of the present disclosure and its equivalent technology, the present disclosure is also intended to include these modifications and variations.

What is claimed is:

1. A display panel, comprising:
   a plane display part;
   a corner display part, located at a corner position on a periphery of the plane display part, and having a plurality of corner pixels, wherein each corner pixel comprises four corner sub-pixels comprising a first corner sub-pixel and a second corner sub-pixel respectively located on two opposite vertexes of a quadrilateral, and a third corner sub-pixel and a fourth corner sub-pixel located on another two opposite vertexes of the quadrilateral; and
   a plurality of corner pixel drive circuits, wherein each corner pixel drive circuit comprises a first corner pixel drive circuit electrically connected to the first corner sub-pixel, a second corner pixel drive circuit electrically connected to the second corner sub-pixel, a third corner pixel drive circuit electrically connected to the third corner sub-pixel, and a fourth corner pixel drive circuit electrically connected to the fourth corner sub-pixel; and the first corner pixel drive circuit, the second corner pixel drive circuit, the third corner pixel drive circuit, and the fourth corner pixel drive circuit are located in a same corner pixel drive circuit row, wherein the first corner pixel drive circuit is different from the third corner pixel drive circuit;

wherein the plane display part comprises a plurality of plane sub-pixels distributed in an array, and a density of the corner sub-pixels is less than a density of the plane sub-pixels.

2. The display panel according to claim 1, wherein the first corner sub-pixel is a sub-pixel emitting blue light, the second corner sub-pixel is a sub-pixel emitting red light, the third corner sub-pixel is a sub-pixel emitting green light and the fourth corner sub-pixel is a sub-pixel emitting green light.

3. The display panel according to claim 1, wherein an extending direction of the corner pixel drive circuit row is parallel to a first direction, and the first corner sub-pixel and the second corner sub-pixel all have overlapping regions with the corner pixel drive circuit row;

the first corner sub-pixel comprises a first anode, and the first anode is electrically connected to the first corner pixel drive circuit at an overlapping position; and the second corner sub-pixel comprises a second anode, and the second anode is electrically connected to the second corner pixel drive circuit at an overlapping position.

4. The display panel according to claim 3, wherein the third corner sub-pixel comprises a third anodes, and the fourth corner sub-pixel comprises a fourth anode; and the display panel further comprises a third connecting line and a fourth connecting line, the third anode is electrically connected to the third corner pixel drive circuit through the third connecting line, and the fourth anode is electrically connected to the fourth corner pixel drive circuit through the fourth connecting line.

5. The display panel according to claim 4, wherein an extending direction of the third connecting line is perpendicular to the first direction;

the fourth connecting line comprise a first connecting portion with an extending direction parallel to the first direction, and a second connecting portion with an extending direction perpendicular to the first direction; and one end of the first connecting portion is electrically connected to the fourth anode, another end of the first connecting portion is electrically connected to the second connecting portion, and another end of the second connecting portion is electrically connected to the fourth corner pixel drive circuit.

6. The display panel according to claim 4, wherein the third connecting line and the third anode are disposed on a same layer and made of a same material, and the fourth connecting line and the fourth anode are disposed on a same layer and made of a same material.

7. The display panel according to claim 1, wherein the plane display part comprises a plurality of pixel row groups, and each pixel row group comprises a first sub-pixel row, a second sub-pixel row, and a third sub-pixel row that are sequentially disposed; and the first corner sub-pixel, the second corner sub-pixel, and the second sub-pixel row are located in a same sub-pixel row.

8. The display panel according to claim 7, wherein the third corner sub-pixel and the first sub-pixel row are located in a same sub-pixel row; and the fourth corner sub-pixel and the third sub-pixel row are located in a same sub-pixel row.

9. The display panel according to claim 7, wherein the each pixel row group further comprises a fourth sub-pixel row located on a side of the third sub-pixel row away from the second sub-pixel row.

10. The display panel according to claim 1, wherein the plane display part comprises a plurality of plane pixel drive circuits electrically connected to the plane sub-pixels in a one-to-one correspondence mode; and a region occupied by the corner pixel drive circuits is smaller than a region occupied by the plane pixel drive circuits.

11. The display panel according to claim 1, wherein interfacing positions of the corner display part where the corner display part is interfaced with the plane display part have a plurality of gate drive circuit groups arranged in sequence in an extending direction of the interfacing positions, and each gate drive circuit group comprises at least two columns of gate drive circuits.

12. The display panel according to claim 11, wherein the corner pixels are disposed between adjacent gate drive circuit groups.

13. The display panel according to claim 12, wherein in the each corner pixel, a minimum width of a gap between the first corner sub-pixel and the second corner sub-pixel in a first direction is the same as a maximum width of the third corner sub-pixel in the first direction.

14. The display panel according to claim 13, wherein a minimum width of a gap between two adjacent corner pixels in a same corner pixel row in the first direction is the same as a maximum width of the fourth corner sub-pixel in the first direction; and a minimum length of a gap between two adjacent corner pixels in a same corner pixel column in a second direction is greater than a width of the fourth corner sub-pixel in the second direction.

15. The display panel according to claim 1, further comprising a plurality of sections of through grooves, and the through grooves are located at gaps between adjacent corner pixels.

16. A display device, comprising a display panel, wherein the display panel comprises:

a plane display part;

a corner display part, located at a corner position on a periphery of the plane display part, and having a plurality of corner pixels, wherein each corner pixel comprises four corner sub-pixels comprising a first corner sub-pixel and a second corner sub-pixel respectively located on two opposite vertexes of a quadrilateral, and a third corner sub-pixel and a fourth corner sub-pixel located on another two opposite vertexes of the quadrilateral; and a plurality of corner pixel drive circuits, wherein each corner pixel drive circuit comprises a first corner pixel drive circuit electrically connected to the first corner sub-pixel, a second corner pixel drive circuit electrically connected to the second corner sub-pixel, a third corner pixel drive circuit electrically connected to the third corner sub-pixel, and a fourth corner pixel drive circuit electrically connected to the fourth corner sub-pixel; and the first corner pixel drive circuit, the second corner pixel drive circuit, the third corner pixel drive circuit, and the fourth corner pixel drive circuit are located in a same corner pixel drive circuit row, wherein the first corner pixel drive circuit is different from the third corner pixel drive circuit;

wherein the plane display part comprises a plurality of plane sub-pixels distributed in an array, and a density of the corner sub-pixels is less than a density of the plane sub-pixels.

17. The display device according to claim 16, wherein the first corner sub-pixel is a sub-pixel emitting blue light, the second corner sub-pixel is a sub-pixel emitting red light, the third corner sub-pixel is a sub-pixel emitting green light and the fourth corner sub-pixel is a sub-pixel emitting green light.

18. The display device according to claim 16, wherein an extending direction of the corner pixel drive circuit row is parallel to a first direction, and the first corner sub-pixel and the second corner sub-pixel all have overlapping regions with the corner pixel drive circuit row;
the first corner sub-pixel comprises a first anode, and the first anode is electrically connected to the first corner pixel drive circuit at an overlapping position; and the second corner sub-pixel comprises a second anode, and the second anode is electrically connected to the second corner pixel drive circuit at an overlapping position.

19. The display device according to claim 18, wherein the third corner sub-pixel comprises a third anodes, and the fourth corner sub-pixel comprises a fourth anode; and
the display panel further comprises a third connecting line and a fourth connecting line, the third anode is electrically connected to the third corner pixel drive circuit through the third connecting line, and the fourth anode is electrically connected to the fourth corner pixel drive circuit through the fourth connecting line.

* * * * *